(12) United States Patent
Honkura et al.

(10) Patent No.: US 8,378,670 B1
(45) Date of Patent: Feb. 19, 2013

(54) MAGNETO-IMPEDANCE ELEMENT AND MAGNETO-IMPEDANCE SENSOR INCLUDING DETECTION COIL

(75) Inventors: Yoshinobu Honkura, Tokai (JP); Michiharu Yamamoto, Tokai (JP)

(73) Assignee: Aichi Steel Corporation, Tokai-shi (JP)

( * ) Notice: Subject to any disclaimer, the term of this patent is extended or adjusted under 35 U.S.C. 154(b) by 222 days.

(21) Appl. No.: 12/681,527

(22) PCT Filed: Oct. 2, 2008

(86) PCT No.: PCT/JP2008/067946
§ 371 (c)(1),
(2), (4) Date: Jun. 9, 2010

(87) PCT Pub. No.: WO2009/044820
PCT Pub. Date: Apr. 9, 2009

(30) Foreign Application Priority Data

Oct. 2, 2007 (JP) ................................. 2007-258578

(51) Int. Cl.
*G01R 33/02* (2006.01)
(52) U.S. Cl. ........................................ 324/244; 324/252
(58) Field of Classification Search .................... None
See application file for complete search history.

(56) References Cited

U.S. PATENT DOCUMENTS

| | | | | |
|---|---|---|---|---|
| 2,856,581 A | * | 10/1958 | Alldredge | ..................... 324/253 |
| 5,994,899 A | | 11/1999 | Mohri | |
| 6,380,735 B1 | * | 4/2002 | Kawakami | ..................... 324/253 |
| 2001/0030537 A1 | | 10/2001 | Honkura et al. | |
| 2006/0038561 A1 | | 2/2006 | Honkura et al. | |

FOREIGN PATENT DOCUMENTS

| | | |
|---|---|---|
| JP | 52 30884 | 7/1977 |
| JP | 2000 258517 | 9/2000 |
| JP | 2003 315376 | 11/2003 |

OTHER PUBLICATIONS

Extended Search Report issued Nov. 16, 2011 in Europe Application No. 08836577.0.
The First Office Action issued Apr. 16, 2012 in Chinese Patent Application No. 200880110503.7 (with English translation).
The First Office Action issued Apr. 16, 2012 in Chinese Patent Application No. 200880110503.7 (Submitting Complete English translation only).

* cited by examiner

*Primary Examiner* — Vinh Nguyen
(74) *Attorney, Agent, or Firm* — Oblon, Spivak, McClelland, Maier & Neustadt, L.L.P.

(57) ABSTRACT

A magneto-impedance element includes a magnetic sensitive member having a form of a line, whose electromagnetic characteristics vary depending on an external magnetic field, a pulse current flowing from one to another end portion thereof in an axial direction. A conductive layer is arranged on an insulating layer provided on an outer surface of the magnetic sensitive member. A connection portion, electrically connecting the magnetic sensitive member and the conductive layer, is arranged on the other end portion in the axial direction of the magnetic sensitive member. A detection coil, outputting an induced voltage corresponding to an intensity of an external magnetic field acting on the magnetic sensitive member when the pulse current flows in the magnetic sensitive member, is wounded around the conductive layer. A direction of the pulse currents flowing in the magnetic sensitive member and in the conductive layer are opposite each other.

5 Claims, 10 Drawing Sheets

MAGNETO-IMPEDANCE ELEMENT AND MAGNETO-IMPEDANCE SENSOR INCLUDING DETECTION COIL

TECHNICAL FIELD

The present invention relates to a magneto-impedance element and a magneto impedance sensor having good linearity.

BACKGROUND ART

As a conventional magnetic sensor (hereinafter referred to as an MI sensor) using a magneto-impedance element (hereinafter referred to as an MI element), for example, a magnetic sensor having a detection coil wound around an amorphous wire is known. Patent Document 1 discloses a MI sensor which causes a pulse current to pass through an amorphous wire and measures a first pulse of an induced voltage output from a detection coil to make it possible to sensitively detect an external magnetic field Hex. The MI element is also called a giant magneto-impedance element or a GMI element. The MI sensor is also called a giant magneto-impedance sensor or a GMI sensor.

Patent Document 1: Japanese Unexamined Patent Application Publication No. 2000-258517

Figure 10:
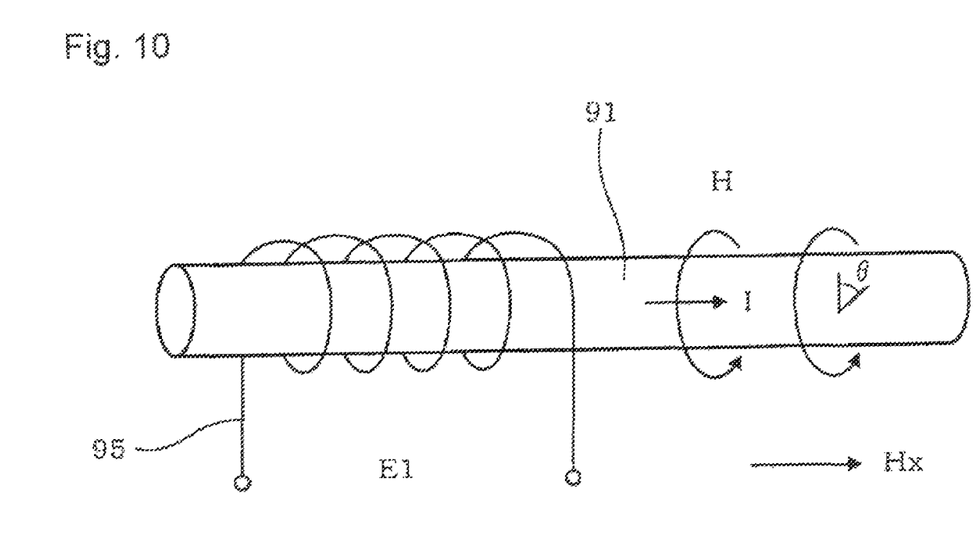
FIG. 10 is a diagram showing an operational principle of a magneto-impedance element according to a conventional example.

As will be described below, a principle of magnetic field detection by the MI element will be explained with reference to FIG. 10.

As shown in the drawing, when a pulse current I passes through an amorphous magnetic wire 91, a magnetic field H is caused in a circumferential direction by the pulse current I. An induced voltage (dH/dt) is output from a detection coil 95. In the case where an external magnetic field Hx is applied in the state that the pulse current I flows, spins arranged in a circumferential direction of the amorphous magnetic wire 91 resonate and shake by θ. An induced voltage (dMθ/dt) generated by the spin resonance θ is output to the detection coil 95 overlapping the induced voltage (dH/dt). More specifically, in application of an external magnetic field Hx, an induced voltage (dH/dt+dMθ/dt) is output.

Figure 11:
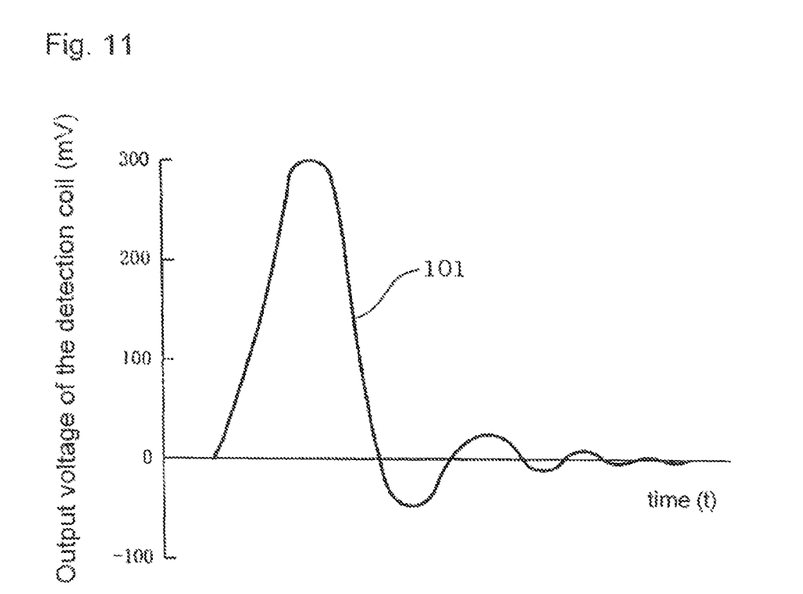
FIG. 11 is a waveform chart showing an output characteristic of a detection coil with respect to a pulse current according to a conventional example.

FIG. 11 is a waveform chart showing an output of an induced voltage to a pulse current of the MI sensor using the MI element. This is a waveform chart 101 showing a time variation of induced voltage in damped oscillation output from a detection coil when the pulse current I flows in application of the external magnetic field Hx.

Figure 12:
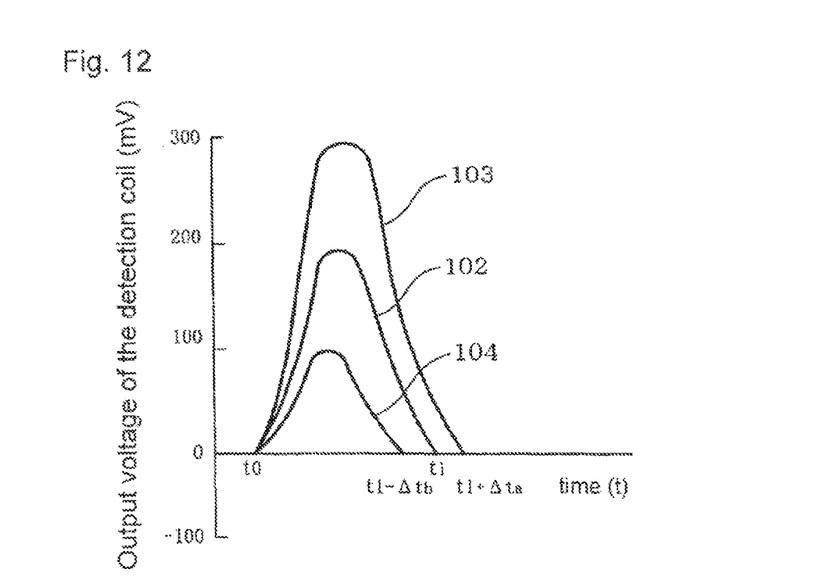
FIG. 12 is a waveform chart of a first pulse output from the detection coil and is also a waveform chart obtained when an external magnetic field is set to be +Hx, 0, and −Hx(G) according to a conventional example.

FIG. 12 shows a waveform chart 102 showing a time variation in induced voltage caused only by the pulse current I without applying the external magnetic field Hx with respect to a peak characteristic of the first pulse in the waveform chart 101, a waveform chart 103 and a waveform chart 104, each showing a time variation in induced voltage when the external magnetic field Hx is applied (+Hx and −Hx).

As shown in FIG. 12, times (t) for zero crossing of the induced voltages when the first pulses damped in the waveform charts 102 to 104 are not equal to each other and have a phase difference. With respect to time t1 at which zero crossing is caused only by the pulse current I without applying an external magnetic field, time at which zero crossing occurs when an external magnetic field +Hx is applied is given by t1+Δta to cause a delay (Δta). When an external magnetic field −Hx is applied, the time for zero crossing is given by t1−Δtb, the zero crossing time is earlier (Δtb).

As a result, when the external magnetic field changes in polarity from +Hx to −Hx (FIG. 12), it is found that time at which an output voltage of the detection coil reaches a peak varies as zero crossing time varies. The present inventors devotedly studied the cause, and conceived the followings.

There is a phase difference in peak time between a time variation waveform of an output voltage by dH/dt which is a component caused by a pulse current and a time variation waveform of an output voltage by dMθ/dt which is a component varying (changing) depending on an external magnetic field. For this reason, an induced voltage waveform generated in the detection coil, which is a combination of two waveforms, has a phase difference with respect to peak time of an output voltage generated by dH/dt which is a component caused by the pulse current. A peak voltage of a time variation waveform in output voltage by dMθ/dt which is a component varying depending on the external magnetic field rises with an increase in external magnetic field. For this reason, a phase difference of an induced voltage waveform generated in the detection coil which is a combination of two waveforms is supposed to be changed with respect to peak time of an output voltage generated by dH/dt as the external magnetic field changes.

As will be described below, a known magneto-impedance sensor (hereinafter arbitrarily referred to as a MI element) uses the fact that a peak value of an output voltage of the detection coil is in proportion to an external magnetic field parallel to a magnetic sensitive member used in a magneto-impedance element (hereinafter arbitrarily referred to as a MI element).

Figure 6:
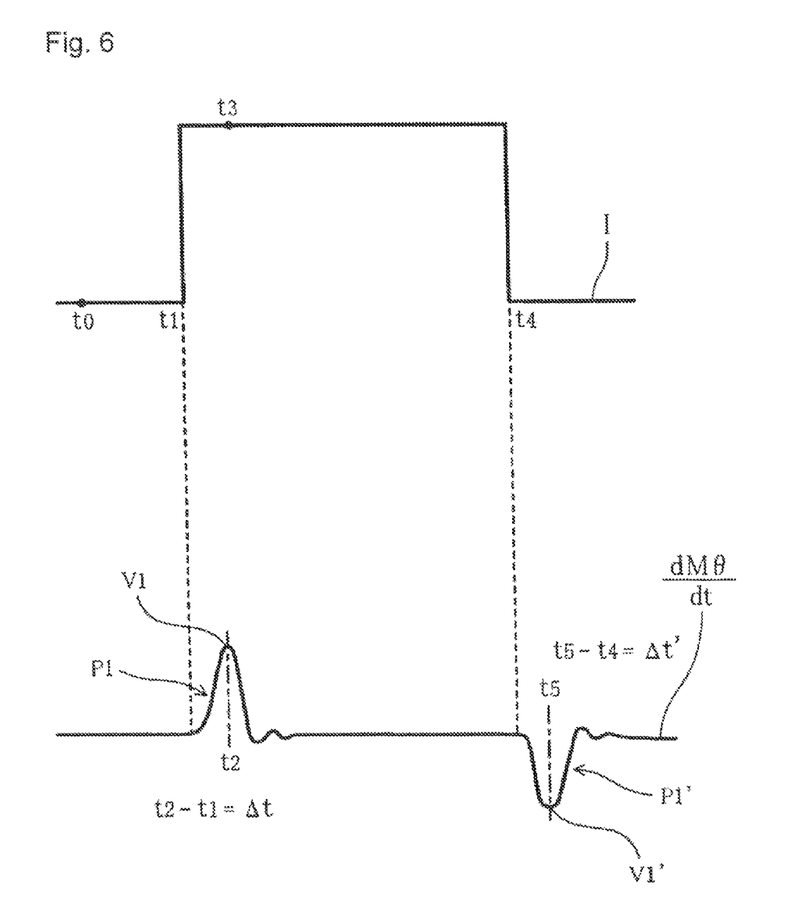
FIG. 6 is a diagram showing a relationship between a pulse current flowing in the magnetic sensitive member and an induced voltage output to a detection coil according to Embodiment 1.

In the MI sensor using the current MI element, on the basis of time t1 at which the pulse current rises as shown in FIG. 6 (described later), an analog switch is turned on-off for a short period of time at predetermined timing t2 at which a peak value is supposed to be given in an induced voltage waveform generated in the detection coil to detect a peak value of an output voltage generated in the detection coil corresponding to an external magnetic field. In this case, when a predetermined input current waveform and an output voltage waveform corresponding to the input current waveform are present, a sampling timeΔt is obtained by subtracting rise time t1 of the pulse current from a predetermined timing t2 at which a peak value is supposed to be given in the output voltage waveform (Δt=t2−t1).

In general, time at which an external magnetic field is applied such that a sampling time Δt is fixed in the absence of an external magnetic field (102 in FIG. 12) is also measured.

For this reason, when time at which an output voltage of the detection coil reaches a peak is varied by an external magnetic field as shown in FIG. 12, if the external magnetic field is applied, voltages are sampled at a timing deviated from time at which the output voltage reaches a peak value, so that sensitivity and linearity are deteriorated because the output voltage drops.

With a change in material characteristic of an electric resistance or the like of a magnetic sensitive member with a change in temperature, a pulse current flowing in the magnetic sensitive member changes. When the pulse current changes, a circumferential magnetic field H caused by the pulse current varies as a matter of course. Therefore, the circumferential magnetic field H caused by the pulse current independently of magnetization (M) of the magnetic sensitive member is varied by the change in temperature. According to this, deterioration in linearity and drift of an original point (in this example, a peak value of an output voltage generated without applying a magnetic field) occur.

DISCLOSURE OF THE INVENTION

Problems to be Solved by the Invention

However, a conventional magnetic sensor disadvantageously requires a feedback coil (not shown) wounded around an amorphous magnetic wire 91 and a feedback circuit (not shown) to supply a current to the feedback coil in order to improve linearity. As a result, a circuitry becomes complex and the magnetic sensor may be large. When the feedback circuit is omitted, a sufficient detection accuracy may not be obtained. In order to drive the feedback coil and the feedback circuit, a power consumption disadvantageously increases.

In particular, for a magnetic sensor installed in, for example, a cellular phone or the like to measure direction, both a function which can detect a magnetic field at a high accuracy by improving the linearity and a function which achieves a low power consumption by simplifying a circuitry are required.

The present invention is made in consideration of the problems in the conventional magneto-impedance sensor, and has an object to provide a magneto-impedance element and a magneto-impedance sensor which are good in linearity and temperature characteristic without using a feedback circuit.

Means for Solving the Problems

According to a first aspect of the present invention, a magneto-impedance element includes a magnetic sensitive member having the form of a line, whose electromagnetic characteristics vary depending on a magnetic field acting from the outside, and in which a pulse current flows from one end portion thereof to the other end portion in an axial direction; a conductive layer arranged on an insulating layer provided on an outer surface of the magnetic sensitive member; a connection portion arranged at the other end portion in an axial direction of the magnetic sensitive member to electrically connect the magnetic sensitive member and the conductive layer to each other; and a detection coil wounded around the conductive layer to output an induced voltage corresponding to an intensity of the external magnetic field acting on the magnetic sensitive member when the pulse current flows in the magnetic sensitive member, wherein a direction of the pulse current flowing in the magnetic sensitive member and a direction of the pulse current flowing in the conductive layer are opposite to each other.

Effect of the Invention

An effect of the present invention will be then described below.

In the present invention, a conductive layer is formed around a magnetic sensitive member, and the magnetic sensitive member and the conductive layer are connected to each other by the connection portion. In this manner, the direction of a pulse current flowing in the magnetic sensitive member and a direction of a pulse current flowing in the conductive layer are opposite to each other. For this reason, a magnetic field caused outside of the magnetic sensitive member by the pulse current flowing in magnetic sensitive member and a magnetic field caused outside of the conductive layer by the pulse current flowing in the conductive layer cancel out. In this manner, in an induced voltage output from the detection coil, dH/dt which is a component caused by the pulse current supposed to cause deterioration in linearity or the like can be weakened, and only dMθ/dt which is a component varying depending on an external magnetic field can be detected.

For this reason, linearity between the external magnetic field and the induced voltage can be improved. Since a feedback coil and a feedback circuit need not to be arranged, power consumption can be reduced.

As described above, according to the present invention, a magneto-impedance element which is good in linearity can be provided without using a feedback circuit.

BEST MODE FOR CARRYING OUT THE INVENTION

A preferable embodiment according to the present invention described above will be described below.

In the present invention, the magnetic sensitive member is formed to have a circular section, the conductive layer is formed to have a cylindrical shape, and the conductive layer is preferably arranged coaxially with the magnetic sensitive member.

In this case, in comparison with a magnetic sensitive member having a noncircular section or a magnetic sensitive member not coaxial with a conductive layer, a magnetic field caused by a pulse current and radiated to the outside of the conductive layer can be made almost zero. In this manner, in the induced voltage output from the detection coil, dH/dt is almost eliminated, and only dMθ/dt which is a component varying depending on an external magnetic field can be detected.

The magnetic sensitive member preferably is made of an amorphous magnetic material. The amorphous magnetic material can be preferably used as a magnetic sensitive member according to the present invention because the amorphous magnetic material has a property (magneto-impedance effect) in which electromagnetic characteristics change depending on the magnitude of a magnetic field acting from the outside.

Some of the amorphous magnetic material are made of a CoFeSiB-based alloy.

The CoFeSiB-based alloy is a soft magnetic material, the magnetic characteristics of which largely change depending on the magnitude of a magnetic field acting from the outside, and is a low-magnetostrictive material, thereby to be preferably used as the magnetic sensitive member according to the present invention.

The magnetic sensitive member is made of a known material having the above characteristics, or is made of a CoMSiB-based amorphous alloy or a Fe—Si-based amorphous alloy.

The conductive layer may preferably be a plated film or a sputtered film, made of copper or aluminum, respectively.

In this case, by using a plating method or a sputtering method, a thin conductive layer can be easily formed.

According to a second aspect of the present invention, a magneto-impedance element includes an amorphous magnetic wire to which a pulse current is supplied, a conductive layer arranged on an insulating layer provided on an outer surface of the amorphous magnetic wire, and a connection portion formed of a conductor which electrically connects the amorphous magnetic wire to the conductive layer on one end face of the amorphous magnetic wire In contrast to a conventional structure in which a detection coil is wounded around an amorphous magnetic wire, in the present invention, a conductive layer is arranged on an insulating layer provided around the amorphous magnetic wire, the amorphous magnetic wire serving as a conductor and the conductive layer are electrically connected to each other to make a direction of a pulse current flowing in the amorphous magnetic wire and a direction of a pulse current flowing in the conductive layer reversed. For this reason, the effect described above (described in "Effect of the Invention") can be obtained.

The magneto-impedance sensor according to the present invention includes the magneto-impedance element, a pulse generator which generates the pulse current to be input to the magnetic sensitive member, and a sample-and-hold circuit which is connected to the detection coil and samples and holds the induced voltage output from the detection coil when the pulse current flows.

In this case, unlike in a conventional magneto-impedance sensor, since a feedback coil and a feedback circuit to cancel out an external magnetic field need not to be arranged, a power consumption of the magneto-impedance sensor can be reduced.

A giant magnet impedance element (magneto-impedance element) according to the present invention includes a substrate made of a nonmagnetic material, a coaxial core having, as an axis, an amorphous magnetic wire (magnetic sensitive member) to which a pulse current is applied, and a detection coil formed around the coaxial core.

As the non-magnetic substrate, an insulating alumina-based ceramics, a semiconductor silicon wafer, a conductive metal, or the like can be preferably used.

The coaxial core includes an amorphous magnetic wire (magnetic sensitive member) and a conductive layer arranged on an insulator (insulating layer) provided around the amorphous magnetic wire (magnetic sensitive member). In the coaxial core, the amorphous magnetic wire (magnetic sensitive member) and the conductive layer are electrically connected to each other on one end face of the coaxial core by a conductor (connection portion).

An input electrode terminal is constituted of an electrode terminal connected to the amorphous magnetic wire (magnetic sensitive member) and an electrode terminal connected to the conductive layer.

With this configuration, when a pulse current flows in the amorphous magnetic wire (magnetic sensitive member), the pulse current flowing in the amorphous magnetic wire (magnetic sensitive member) flows into a conductor (connection portion) of the end face of the coaxial core, then the pulse current flows in the conductive layer in a direction opposite to a direction of the pulse current flowing in the amorphous magnetic wire (magnetic sensitive member) in the conductive layer around the amorphous magnetic wire (magnetic sensitive member).

Therefore, a circumferential magnetic field +H caused by a pulse current I flowing in the amorphous magnetic wire (magnetic sensitive member) and a circumferential magnetic field −H caused by a pulse current flowing in the conductive layer cancel out. As a result, in a detection coil 5, an induced voltage (dH/dt) is not generated by the pulse current I.

The insulator of the coaxial core is provided to surely insulate the amorphous magnetic wire with the conductive layer, and is made of inorganic material such as a glass film to coat the amorphous magnetic wire or an $SiO_2$ film formed by a CVD method, or an organic material having an insulating property, such as an epoxy resin.

The conductive layer of the coaxial core is made of a plated film such as a copper plating or an aluminum plating, a sputtered film made of copper or the like, or a thin film formed by a PVD method or a CVD method. The conductive layer is preferably made of a nonmagnetic material. With a magnetic conductive layer, the conductive layer itself is magnetized by a circumferential magnetic field formed by a current flowing in the conductive layer, which causes noise generation, deterioration of the linearity of the sensor, and decrease in an S/N ratio.

The connection portion which electrically connects one end face of the coaxial core may be formed by the plated film, the sputtered film, or bonding of gold or the like.

The detection coil includes a lower coil including a plurality of lower conductive films arranged on a flat surface of a substrate and an upper coil including a plurality of upper conductive films formed on an outer surface of the insulator formed to include the coaxial core, and arranged on the surface of the lower coil and in the same direction as that of the lower conductive films.

Both the ends of the detection coil are connected to the output electrode terminals.

The lower conductive films and the upper conductive films are formed by sputtered films made of a conductive metal such as copper or aluminum, thin films formed by a PVD method or a CVD method, or plated films.

The insulator including the coaxial core made of an inorganic material such as an $SiO_2$ formed by a CVD method and an organic material having insulating property, such as an epoxy resin.

EMBODIMENTS

Embodiment 1

A magneto-impedance element and a magneto-impedance sensor according to an embodiment of the present invention will be described below with reference to FIGS. 1 to 9.

Figure 1:
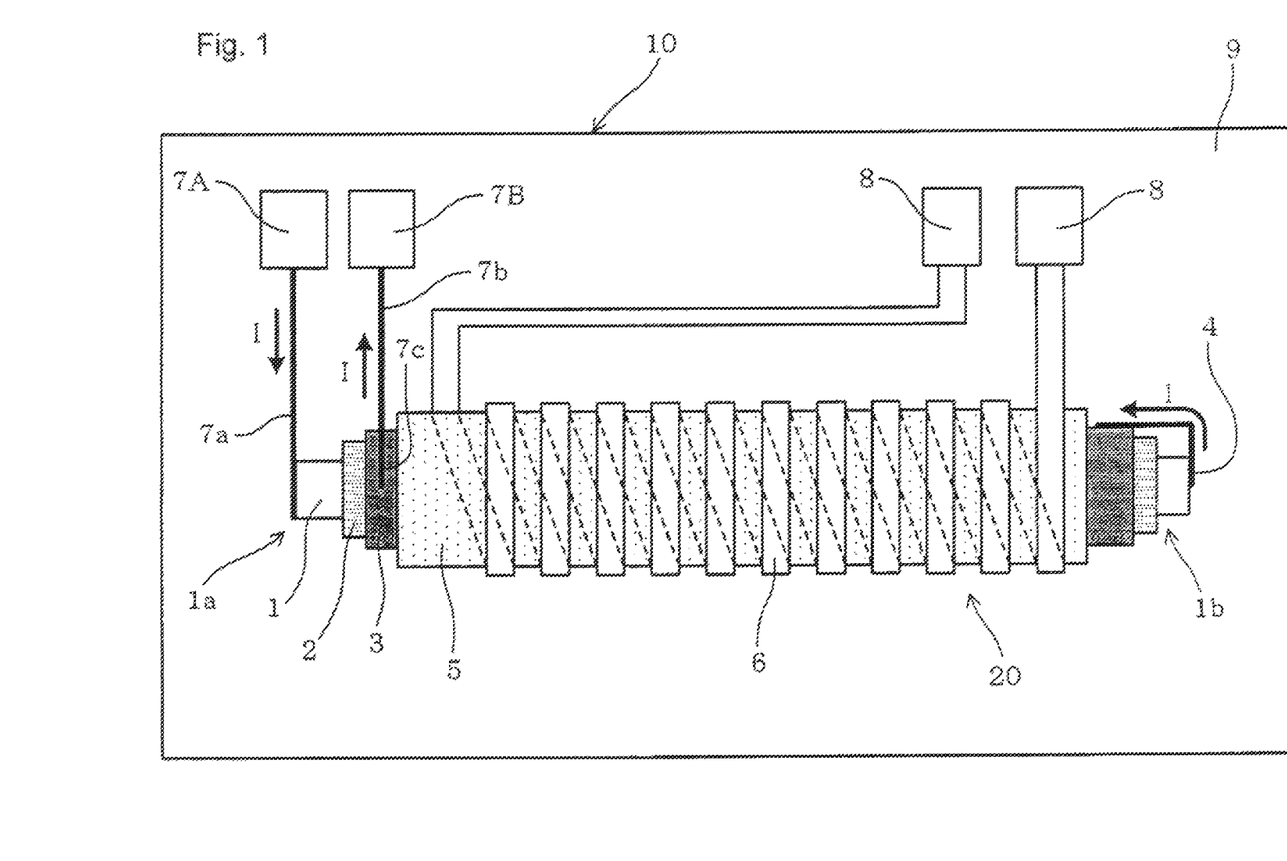
FIG. 1 is a schematic view of a magneto-impedance element according to Embodiment 1.
Figure 2:
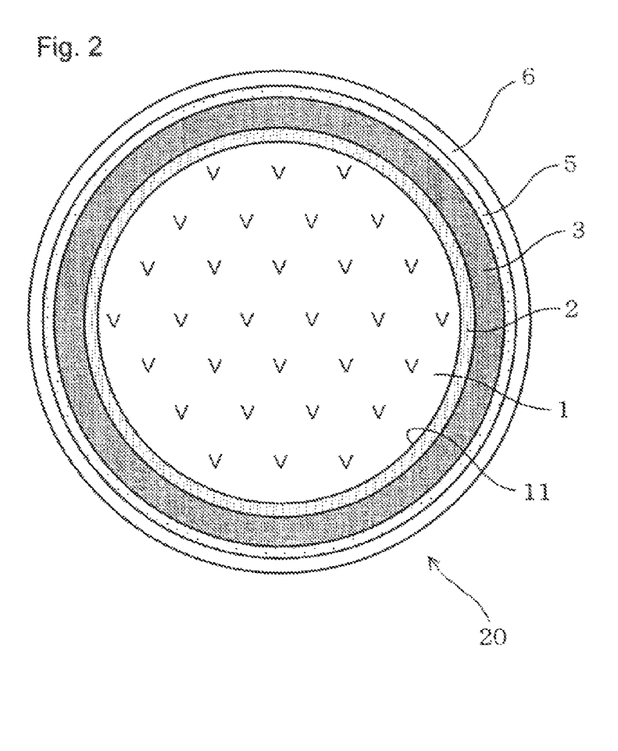
FIG. 2 is a schematic sectional view of the magneto-impedance element according to Embodiment 1.
Figure 3:
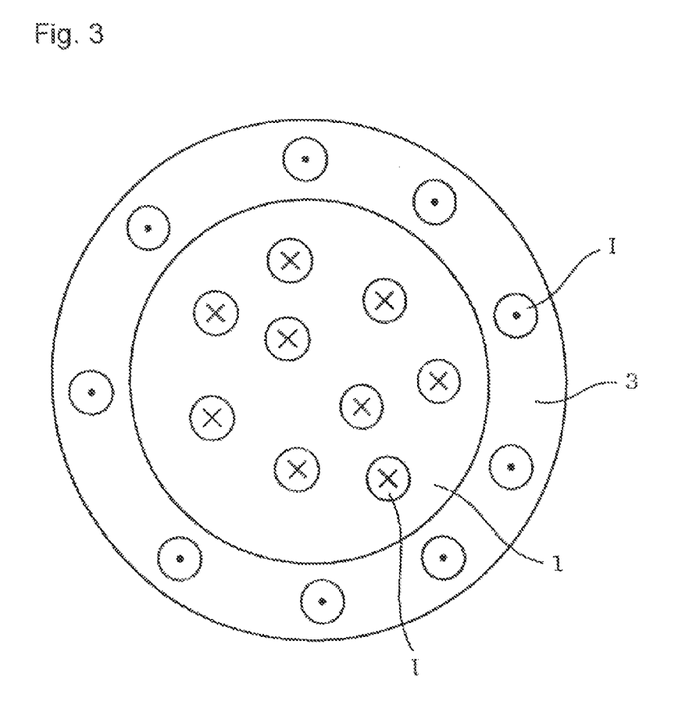
FIG. 3 is a conceptual diagram showing directions of pulse current flowing in a magnetic sensitive member and a conductive layer according to Embodiment 1.

FIG. 1 is a schematic view of a magneto-impedance element 10, and FIG. 2 is a sectional view of the magneto-impedance element 10. FIG. 3 is a schematic diagram showing a flowing direction of a pulse current I.

As shown in FIG. 1, the magneto-impedance element 10 includes a magnetic sensitive member 1 having the form of a line and electromagnetic characteristics variable under the influence of a magnetic field acting from the outside, in which a pulse current I flows from one end portion 1a to the other end portion 1b in an axial direction.

A conductive layer 3 is arranged on an insulating layer 2 provided on an outer surface of the magnetic sensitive member 1.

A connection portion 4 which electrically connects the magnetic sensitive member 1 and the conductive layer 3 to each other is arranged on the other end portion 1b in the axial direction of the magnetic sensitive member 1.

Furthermore, a detection coil 6 which outputs an induced voltage corresponding to intensity of an external magnetic field acting on the magnetic sensitive member 1 when the pulse current I flows in the magnetic sensitive member 1, is wounded around the conductive layer 3.

As shown in FIG. 3, a direction of the pulse current I flowing in the magnetic sensitive member 1 and a direction of the pulse current I flowing in the conductive layer 3 are opposite to each other.

As shown in FIG. 1, the magneto-impedance element 10 includes a first electrode 7a connected to the one end portion 1a of the magnetic sensitive member 1 and a second electrode 7b connected to the conductive layer 3. A pulse voltage is applied between the first electrode 7a and the second electrode 7b. A detection coil 6 is arranged between a contact portion 7c where the second electrode 7b is in contact with the conductive layer 3, and the connection portion 4.

FIG. 1 is a diagram showing an outline of the giant magneto-impedance element 10 (magneto-impedance element 10).

On a flat surface of a substrate 9 consisting of a nonmagnetic silicon wafer, the giant magneto-impedance element 10 has the amorphous magnetic wire 1 (magnetic sensitive member 1) coated with a glass film 2 (insulating layer 2) having an insulating property, the conductive layer 3 formed by copper plating, a coaxial core (20) configured by the conductor 4 (connection portion 4) formed by a copper plating which electrically connects the amorphous magnetic wire 1 (magnetic sensitive member 1) and the conductive layer 3, an insulator 5 (outside insulating layer 5) made of an epoxy resin configured to include the coaxial core (20), and the detection coil 6 formed to extend from the flat surface of the substrate 9 to an outer surface of the insulator 5 (outside insulating layer 5).

An input electrode terminal includes an electrode terminal 7A from which a pulse current (I) is supplied to the amorphous magnetic wire 1 (magnetic sensitive member 1) and an electrode terminal 7B to which the pulse current (I) returns from the conductive layer 3.

The magneto-impedance element 10 also has an output electrode terminal 8.

In this case, a diameter and a length of the magnetic sensitive member 1 (amorphous magnetic wire) are 7 µm and 1.5 mm, respectively, a CoFeSiB alloy is used as a composition of the amorphous magnetic wire, and the insulating layer 2 made of the glass film has a thickness of 1 µm. A thickness of the outside insulating layer 5 is 2 µm, and the detection coil 6 is coated with an epoxy resin. Thicknesses of the conductive layer 3 and the connection portion 4 are 2 µm each.

A winding number of the detection coil 6 is 30 turns.

As described above, although the magnetic sensitive member 1 has the form of a line, a diameter of 7 µm and a length of 1.5 mm, a conceptual view in which the magnetic sensitive member 1 is shortened in an axial direction is shown in FIG. 1.

The members other than the amorphous magnetic wire preferably made of a nonmagnetic material because of the same reason as stated above about the conductive layer.

As shown in FIG. 2, the magnetic sensitive member 1 is formed to have a circular section, the conductive layer 3 is formed cylindrically and coaxially with the magnetic sensitive member 1.

More specifically, an outer surface 12 of the magnetic sensitive member 1 is coated with the insulating layer 2, and the insulating layer 2 is coated with the conductive layer 3. The conductive layer 3 is coated with the outside insulating layer 5, and the detection coil 6 is wounded around the outside insulating layer 5.

Figure 4:
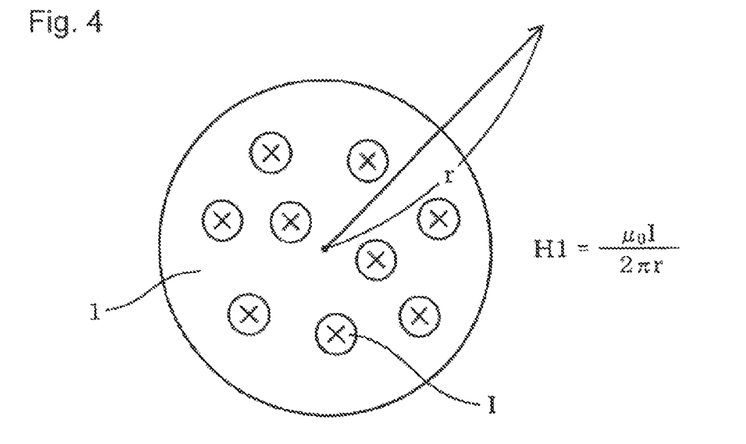
FIG. 4 is a diagram of the magnetic sensitive member extracting from FIG. 3.
Figure 5:
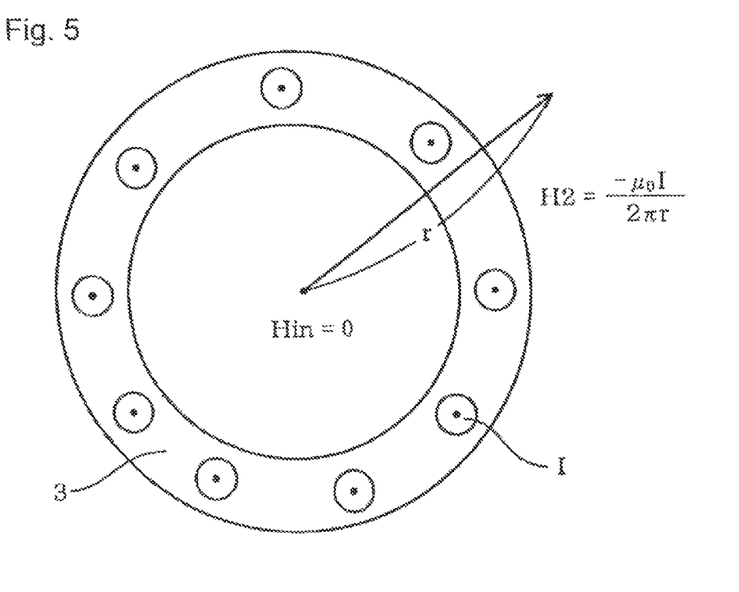
FIG. 5 is a diagram of the conductive layer extracting from FIG. 3.

The reason why the structure is used will be explained with reference to FIGS. 4 and 5. FIG. 4 is a diagram explaining only the magnetic sensitive member 1 shown in FIG. 3, and FIG. 5 is a diagram explaining only the conductive layer 3. As shown in FIG. 4, the pulse current I flows in the magnetic sensitive member 1 to generate a magnetic field H1 outside of the magnetic sensitive member. An intensity of the magnetic field H1 caused by the pulse current I at a position being a distance r from the center of the magnetic sensitive member 1 can be expressed by $H1=-\mu_0 I/2\pi r$ as the magnetic sensitive member 1 has a circular section.

As shown in FIG. 5, a magnitude of the pulse current I flowing in the conductive layer 3 is equal to that of the pulse current I flowing in the magnetic sensitive member 1, and a direction of the pulse current I flowing in the conductive layer 3 and a direction of the pulse current I flowing in the magnetic sensitive member 1 are opposite to each other. For this reason, the magnetic field H2 caused by the pulse current I at a position being the distance r from the center of the conductive layer 3 can be expressed by $H2=-\mu_0 I/2\pi r$ as the conductive layer 3 is arranged cylindrically and coaxially with the magnetic sensitive member 1. For this reason, as shown in FIG. 3, when the magnetic sensitive member 1 is arranged inside of the conductive layer 3, the magnetic field H1 caused outside of the magnetic sensitive member 1 by the pulse current I flowing in the magnetic sensitive member 1 and the magnetic field H2 caused outside of the conductive layer by the pulse current I flowing in the conductive layer 3 cancel out to satisfy H1+H2=0.

As shown in FIG. 5, inside the conductive layer 3, a magnetic field Hin caused by the pulse current I becomes 0. For this reason, as shown in FIG. 3, the magnetic sensitive member 1 arranged inside of the conductive layer 3 is not influenced by a magnetic field generated by the conductive layer 3.

More specifically, with the structure in FIG. 3, the magnetic sensitive member 1 is not influenced by the magnetic field generated by the conductive layer 3, and a magnetic field caused by the pulse current I is not radiated to the outside of the conductive layer 3.

As described above, the magnetic field H1 caused outside of the magnetic sensitive member 1 by the pulse current I flowing in the magnetic sensitive member 1 is canceled out by the magnetic field H2 caused outside of the conductive layer 3 by the pulse current I flowing in the conductive layer 3 (see FIGS. 4 and 5). For this reason, a component dH/dt obtained by a magnetic field H (=H1+H2) caused by the pulse current I is not output from the detection coil 6, and only a component dMθ/dt obtained by magnetization Mθ generated by a spin s is output.

An example of waveform of an induced voltage output from the detection coil 6 is shown in FIG. 6. In this manner, when the pulse current I flows in the magnetic sensitive member 1, magnetization Mθ largely changes. For this reason, an induced voltage dMθ/dt is output to the detection coil 6 as shown in FIG. 6.

The magnetic sensitive member 1 according to this embodiment is made of an amorphous magnetic material made of a CoFeSiB-based alloy.

A magneto-impedance sensor 11 using the magneto-impedance element 10 of the embodiment will be described below.

Figure 7:
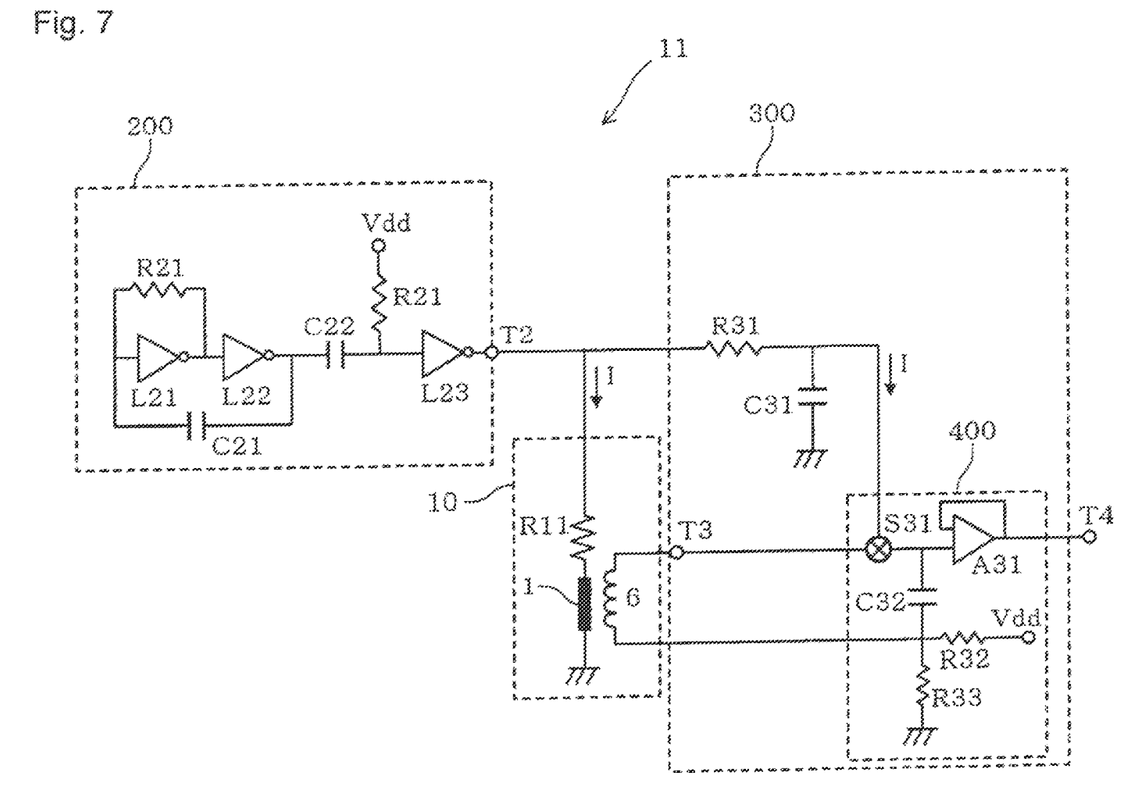
FIG. 7 is a circuit diagram of a magneto-impedance sensor according to Embodiment 1.

As shown in FIG. 7, the magneto-impedance sensor 11 includes the magneto-impedance element 10, a pulse generator 200 which generates the pulse current I input to the magnetic sensitive member 1, and a sample-and-hold circuit 400 which is connected to the detection coil 6 and samples and holds an induced voltage dMθ/dt output from the detection coil 6 when the pulse current I flows. A detection timing can be set to times t2 and t5 in voltage waveforms P1 and P1' in FIG. 6 depending on at rise time or fall time of the pulse current I. At this time, voltages V1 and V1' can be detected.

Also R11 in the magneto-impedance element represents a resistance of the magnetic sensitive member 1 as an equivalent resistance.

Figure 8:
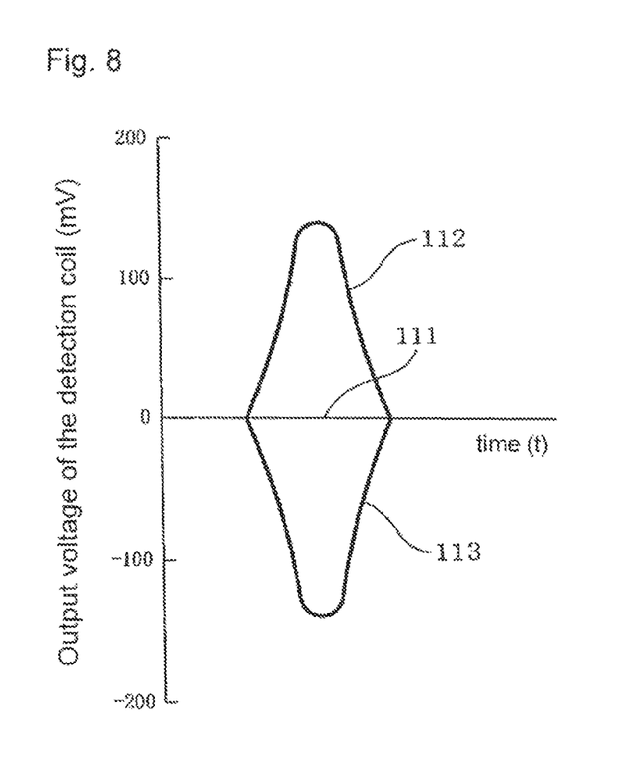
FIG. 8 is a waveform chart showing an output characteristic of the detection coil with respect to a pulse current according to Embodiment 1.
Figure 9A:
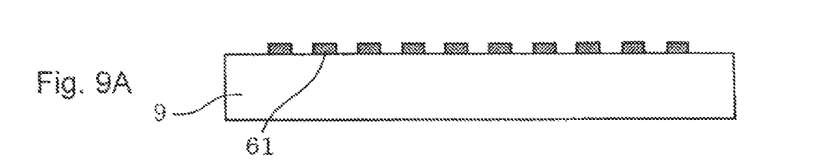
FIG. 9 is a diagram showing a manufacturing process of the magneto-impedance element according to Embodiment 1.
Figure 9B:
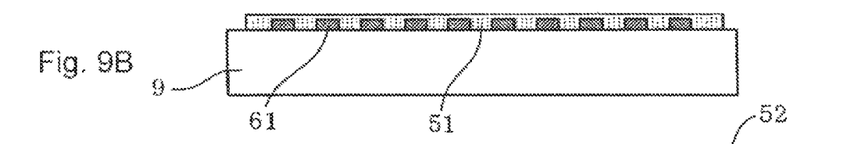
Figure 9C:
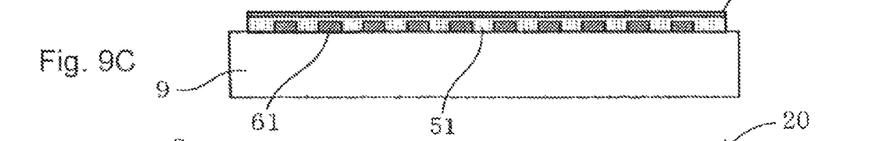
Figure 9D:
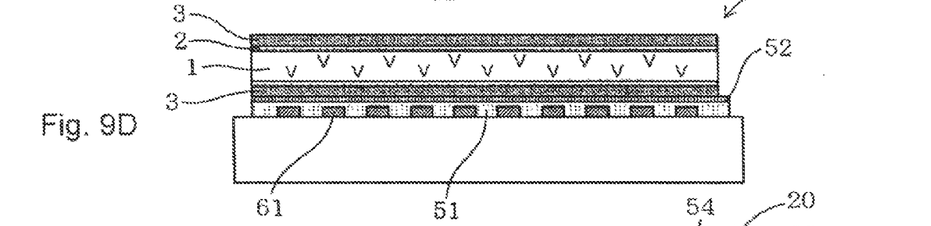
Figure 9E:
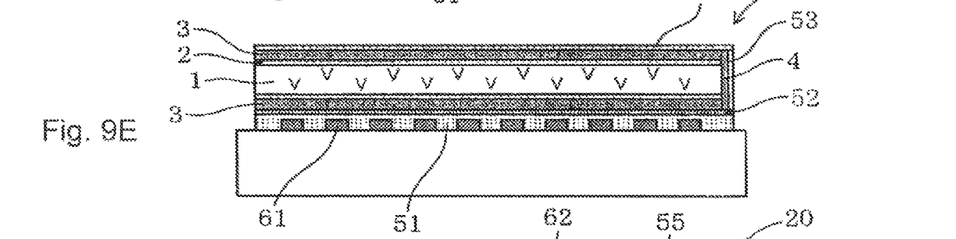
Figure 9F:
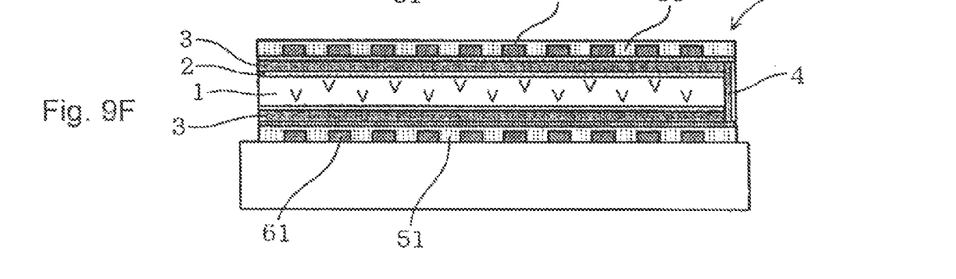

FIG. 8 is a waveform chart obtained when the first pulse P1 is measured by the magneto-impedance sensor 11 according to the embodiment. A waveform obtained when an external magnetic field Hex acting on the magneto-impedance sensor 11 being +2G is represented by 112, and a waveform obtained when the external magnetic field Hex being OG is represented by 111. A waveform obtained when the external magnetic field Hex being −2G is represented by 113. A pulse current in measurement is 180 mA, and a pulse duration time is 50 ns. A rise time and a fall time are 5 ns each.

As is apparent from FIG. 8, in the case of the external magnetic field Hex=0, as shown in the waveform chart 111, an output voltage of the detection coil 6 transits at almost 0 mV. In this manner, it is understood that a noise voltage generated by a circumferential magnetic field H caused by the pulse current I flowing in the magnetic sensitive member 1 is completely eliminated.

The waveform chart 112 of the external magnetic field Hex=+2G and the waveform chart 113 of the external magnetic field Hex=−2G are symmetric, and zero crossing times (t) coincide with each other. As a result, an excellent linearity between an output voltage and an external magnetic field is obtained.

A manufacturing process of the magneto-impedance element 10 will be explained with reference to FIG. 9.

FIG. 9 is a diagram showing steps in manufacturing the magneto-impedance element 10 shown in FIG. 1 and a longitudinal sectional view.

A lower coil 61 constituted by a lower conductive film having a thickness of about 2 μm is formed on a flat surface of the substrate 9 made of alumina-based ceramics by copper plating.

An insulating layer 51 made of an $SiO_2$ film is formed by a CVD method to insulate the lower coil 61 from the conductive layer 3 of the coaxial core 20. Then, an insulating layer 52 made of an epoxy resin is formed by coating.

The coaxial core 20 including the magnetic sensitive member 1 (amorphous magnetic wire), the insulating layer 2 (glass film), and the conductive layer 3 (copper plating) is fixed on the insulating layer 52.

A connection portion 4 is formed by a copper-sputtered film to electrically connect the magnetic sensitive member 1 (amorphous magnetic wire) and the conductive layer 3 on the end face of the coaxial core 20, and the insulating layer 53 of an $SiO_2$ film is formed by a CVD method.

An insulating layer 54 of an $SiO_2$ film layer is formed on an upper portion of the coaxial core 20 by a CVD method, an upper coil 62 constituted by an upper conductive film having a thickness of about 2 μm is formed by a copper plating, and the spiral coil 6 is spirally formed by the lower coil 61 and the upper coil 62.

The upper coil 62 is coated with the insulating layer 55 of a $SiO_2$ film by a CVD method.

Advantages of the magneto-impedance element 10 and the magneto-impedance sensor 11 according to the embodiment will be explained.

In the embodiment, as shown in FIG. 1, the conductive layer 3 is formed around the magnetic sensitive member 1, and the magnetic sensitive member 1 and the conductive layer 3 are connected to each other by the connection portion 4. In this manner, a pulse current having the same magnitude as that of the pulse current flowing in the magnetic sensitive member 1 flows in the conductive layer 3 in a direction opposite to the pulse current flowing in the magnetic sensitive member 1. For this reason, a magnetic field caused outside of the magnetic sensitive member 1 by the pulse current flowing in the magnetic sensitive member 1 and a magnetic field caused outside of the conductive layer 3 by the pulse current flowing in the conductive layer 3 cancel out with each other outside of the conductive layer 3, and a magnetic field is held inside of the magnetic sensitive member. In this manner, in the induced voltage output from the detection coil, dH/dt which is a component caused by the pulse current is weakened, and only dMθ/dt which is a component varying depending on the external magnetic field can be mainly detected.

For this reason, the linearity and temperature characteristic of the external magnetic field and the induced voltage can be improved. Since a feedback coil and a feedback circuit need not to be arranged, power consumption can be reduced.

As shown in FIG. 2, the magnetic sensitive member 1 is formed to have a circular section, the conductive layer 3 is formed cylindrically and coaxially with the magnetic sensitive member 1.

In this case, in comparison with the magnetic sensitive member 1 having a noncircular section or the magnetic sensitive member 1 arranged not coaxially with a conductive layer 3, a magnetic field H caused by the pulse current I and radiated to the outside of the conductive layer 3 can be made almost zero. In this manner, in the induced voltage output from the detection coil 6, dH/dt is almost eliminated, and only dMθ/dt which is a component varying depending on the external magnetic field can be detected.

Furthermore, the conductive layer 3 is a plated film or a sputtered film made of copper or aluminum.

In this case, by using a plating method or a sputtering method, the thin conductive layer 3 can be easily formed.

The magneto-impedance sensor of the embodiment, as shown in FIG. 7, includes the magneto-impedance element 10, the pulse generator 200, and the sample-and-hold circuit 400.

In this case, unlike in a conventional magneto-impedance sensor, since a feedback coil and a feedback circuit need not to be arranged so as to cancel an external magnetic field, a power consumption of the magneto-impedance sensor can be reduced.

A magneto-impedance element is referred to as an MI element. An element manufactured based on the same configuration as in the magneto-impedance element is also referred to as a giant magneto-impedance element or a GMI element.

A magneto-impedance sensor is also referred to an MI sensor, a giant magneto-impedance sensor, or a GMI sensor.

The invention claimed is:

1. A magneto-impedance element comprising:
a magnetic sensitive member having the form of a line, whose electromagnetic characteristics vary depending on a magnetic field acting from the outside, and in which a pulse current flows from one end portion thereof to the other end portion in an axial direction;
a conductive layer arranged on an insulating layer provided on an outer surface of the magnetic sensitive member;
a connection portion arranged at the other end portion in an axial direction of the magnetic sensitive member to electrically connect the magnetic sensitive member and the conductive layer to each other; and
a detection coil wounded around the conductive layer unidirectionally to output an induced voltage corresponding to an intensity of the external magnetic field acting on the magnetic sensitive member when the pulse current flows in the magnetic sensitive member,
wherein a direction of the pulse current flowing in the magnetic sensitive member and a direction of the pulse current flowing in the conductive layer are opposite to each other.

2. The magneto-impedance element according to claim 1, wherein the magnetic sensitive member is formed to have a circular section, the conductive layer is formed to have a cylindrical shape, and the conductive layer is arranged coaxially with the magnetic sensitive member.

3. The magneto-impedance element according to claim 1, wherein the magnetic sensitive member is composed of an amorphous magnetic material.

4. The magneto-impedance element according to claim 1, wherein the conductive layer is a plated film or a sputtered film made of copper or aluminum.

5. A magneto-impedance sensor comprising:
the magneto-impedance element according to any one of claims 1 to 4;
a pulse generator which generates the pulse current input to the magnetic sensitive member; and
a sample-and-hold circuit which is connected to the detection coil and samples and holds the induced voltage output from the detection coil when the pulse current flows.

* * * * *